(12) United States Patent
Kim et al.

(10) Patent No.: US 6,229,166 B1
(45) Date of Patent: May 8, 2001

(54) FERROELECTRIC RANDOM ACCESS MEMORY DEVICE AND FABRICATION METHOD THEREFOR

(75) Inventors: Byung-hee Kim; Hong-bae Park, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/198,374

(22) Filed: Nov. 24, 1998

(30) Foreign Application Priority Data

Dec. 31, 1997 (KR) ................................................ 97-82093

(51) Int. Cl.⁷ .................................................... H01L 29/76
(52) U.S. Cl. .......................... 257/295; 257/306; 257/310
(58) Field of Search .................................. 257/295, 306, 257/308, 310

(56) References Cited

U.S. PATENT DOCUMENTS

| | | | |
|---|---|---|---|
| 5,119,154 | * 6/1992 | Gnadinger | 257/295 |
| 5,206,788 | * 4/1993 | Larson et al. | 257/295 |
| 5,471,364 | 11/1995 | Summerfelt et al. | |
| 5,619,393 | 4/1997 | Summerfelt et al. | |
| 5,650,646 | 7/1997 | Summerfelt | |
| 5,817,170 | * 10/1998 | Desu et al. | 117/2 |

FOREIGN PATENT DOCUMENTS 96-36049   10/1996   (KR).

* cited by examiner

*Primary Examiner*—Sara Crane
(74) *Attorney, Agent, or Firm*—Jones Volentine, L.L.C.

(57) ABSTRACT

A ferroelectric random access memory (FRAM) device, and a fabrication method therefor, includes seed layers above and below a ferroelectric layer. The seed layers formed above and below faces of the ferroelectric layer can prevent an imprint phenomenon from being generated in a ferroelectric capacitor by making the characteristics of the upper and lower interfaces of the ferroelectric layer be the same. This is accomplished by providing upper and lower seed layers that are crystallized prior to the ferroelectric layer during a thermal treatment. This results in crystallization occurring from the upper and lower faces to the center of the ferroelectric layer, making the characteristics of the upper and lower interfaces of the ferroelectric layer the same, thereby improving ferroelectric capacitor characteristics.

15 Claims, 3 Drawing Sheets

FERROELECTRIC RANDOM ACCESS MEMORY DEVICE AND FABRICATION METHOD THEREFOR

This application claims priority under 35 U.S.C. §119 to Korean Application No. 97-82093, which is hereby incorporated by reference in its entirety.

BACKGROUND OF THE INVENTION

1. Field of the Invention

The present invention relates to a semiconductor memory device and a fabrication method therefor, and more particularly, to a ferroelectric random access memory (FRAM) device and a fabrication method therefor.

2. Description of the Related Art

A ferroelectric material has a ferroelectricity. The ferroelectricity is a physical property in which if an external voltage is applied to electric dipoles arranged in the ferroelectric material, a spontaneous polarization of the electric dipoles is generated. A remnant polarization of some constant level remains even after the external electric field is removed. When the remnant polarization of the ferroelectric material is used for storing data, the data can be stored without an external voltage. Also, application of a reverse external field causes polarization in the opposite direction.

The FRAMs using the ferroelectric material are largely classified into two types; a first type which operates by detecting a change in a charge amount stored in a ferroelectric capacitor, and a second type which operates by detecting a change in resistance of a semiconductor due to spontaneous polarization of the ferroelectric material. The first type is typically adapted to a structure in which a unit cell is constituted by one capacitor and one transistor. Particularly, this first type is widely applied to a DRAM, such that a thick interlayer insulating layer is formed on a CMOS structure and a ferroelectric capacitor is formed thereon.

The second type is typically adapted to a metal ferroelectric metal insulator semiconductor (MFMIS) field effect transistor (FET) structure. In the MFMIS FET structure, a unit cell is constituted by one transistor.

The structures of both types have a ferroelectric capacitor structure formed by depositing a lower metal layer/a ferroelectric layer/an upper metal layer. The most widely used ferroelectric capacitor is a ferroelectric layer using PZT ($Pb(Zr_xTi_{1-x})O_3$). The PZT ($Pb(Zr_xTi_{1-x})O_3$) is used because its Curie temperature is relatively high, i.e., 230–490° C., it has different crystalline phases according to Zr/Ti composition and temperature, and it has a high dielectric constant.

However, in the conventional capacitor having a structure of a lower metal layer-PZT layer-upper metal layer, an imprint phenomenon in which a hysteresis curve moves toward a positive or a negative direction along an electric field axis occurs. If the imprint phenomenon occurs, the absolute values of positive and negative coercive voltages become different from each other, which destroys symmetry and reduces a remnant polarization value Pr.

The imprint phenomenon is caused by a difference in characteristics between an upper interface between the upper metal layer and PZT layer and a lower interface between the lower metal layer and PZT layer. This difference in characteristics is caused by a thermal treatment of the PZT layer. In other words, after the PZT layer is deposited on the lower metal layer, if the PZT layer is thermally treated for crystallization, Pb present in the PZT layer moves toward the interface adjacent the lower metal layer, thereby changing the interface characteristics. However, since the upper metal layer is formed on the thermally treated PZT layer, the upper layer does not experience such a change as the lower metal layer. Thus, the upper and lower interfaces of the PZT layer become different in their characteristics, causing the imprint phenomenon.

SUMMARY OF THE INVENTION

To solve the above problems, it is an object of the present invention to provide a ferroelectric random access memory (FRAM) device having a ferroelectric layer with the same characteristics of upper and lower interfaces so that an imprint phenomenon does not occur.

It is another object of the present invention to provide a fabrication method suitable for fabricating, a FRAM device having, a ferroelectric layer with the same upper and lower interface characteristics.

Accordingly, the first and other objects may be realized by providing a ferroelectric random access memory (FRAM) device including a lower electrode, a lower seed layer formed on the lower electrode, a ferroelectric layer formed on the lower seed layer, an upper seed layer formed on the ferroelectric layer, and an upper electrode formed on the upper seed layer. The upper and lower seed layers make characteristics of an upper interface and a lower interface of the ferroelectric match each other. The ferroelectric layer may be a PZT layer.

The upper and lower seed layers may be composed of a material having a crystallization temperature lower than that of a material of the ferroelectric layer. The upper and lower seed layers may be composed of a ferroelectric material having a lattice constant similar to that of a material of the ferroelectric layer. The upper and lower seed layers may be composed of $PbTiO_3$, $TiO_2$ or PZT having at least one of a higher Pb content and a higher Ti composition ratio than the PZT of the ferroelectric layer. The upper and lower seed layers are composed of the same material.

The upper and lower electrodes may include a Pt-group metal layer, a conductive oxide layer or a dual layer of the Pt-group metal layer and the conductive oxide layer. The upper and lower electrodes have the same structure. A switching element may be electrically connected to the lower electrode. The FRAM device may further include a gate insulating layer under the first electrode, a semiconductor substrate under the gate insulating layer, and source and drain regions in a portion of the semiconductor substrate adjacent to a periphery of the gate insulating layer.

The second and other objects of the present invention may be realized by providing a method for fabricating a ferroelectric random access memory (FRAM) device including forming a lower electrode, forming a lower seed layer on the lower electrode, forming a ferroelectric layer on the lower seed layer, forming an upper seed layer on the ferroelectric layer, annealing a resulting structure including the upper seed layer, including making characteristics of a lower face and an upper face of the ferroelectric layer be the same and completing a stable perovskite crystal structure of the ferroelectric layer, and forming an upper electrode on the upper seed layer.

The forming the ferroelectric layer may include forming a PZT ferroelectric layer on the lower seed layer. The forming the upper and lower seed layers may include using a material having a crystallization temperature lower than that of a material for forming the ferroelectric layer. The forming the upper and lower seed layers may include using a ferroelectric material having a lattice constant similar to that of a material for forming the ferroelectric layer. The upper and lower seed layers may include using $PbTiO_3$, $TiO_2$ or PZT having at least one of a higher Pb content and a higher Ti composition ratio than a PZT to be used to form the ferroelectric layer.

The forming the lower electrode and the upper electrode may include using a Pt-group metal layer, a conductive oxide layer or a dual layer of the Pt-group metal layer and the conductive oxide layer. Prior to the forming the lower electrode, forming a switching element to be electrically connected to the lower electrode may be included. The method may further include, before the forming the lower electrode, providing a semiconductor substrate and forming a gate insulating layer on the semiconductor substrate, and, after the forming the upper electrode, forming source and drain regions in a portion of the semiconductor substrate adjacent to a periphery of the gate insulating layer.

According to the present invention, since the characteristics of the upper and lower interfaces become the same with each other by upper and lower seed layers, an imprint phenomenon can be effectively prevented in the ferroelectric random access memory device having a lower seed layer-ferroelectric layer-upper seed layer structure.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
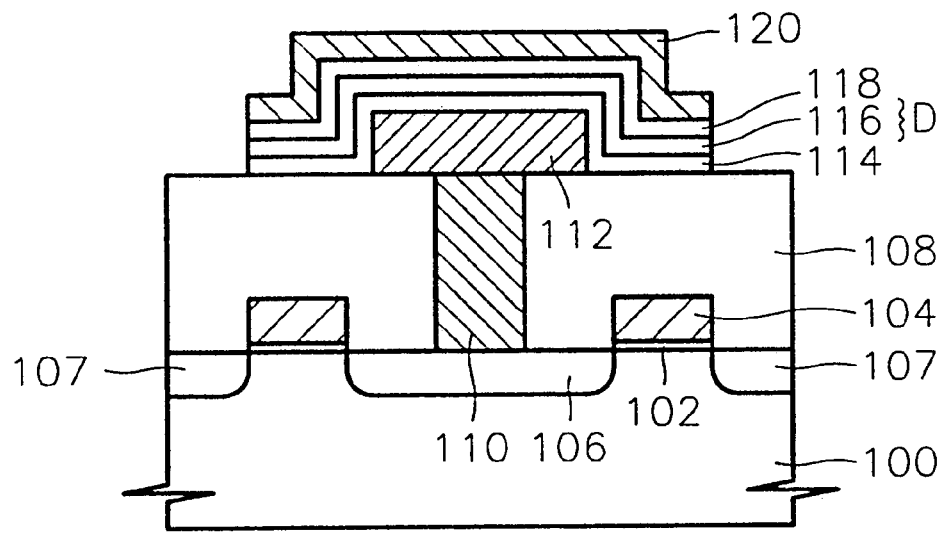
FIG. 1 is a sectional view of a FRAM device according to a first embodiment of the present invention, which operates by detecting a charge change in the ferroelectric capacitor.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements.

First Embodiment of the FRAM Device

FIG. 1 is a sectional view of a FRAM device according to a first embodiment of the present invention, which operates by detecting a charge change in the ferroelectric capacitor.

A transistor including a gate 104 formed by interposing a gate insulating layer 102 on a semiconductor substrate 100, a source region 106 and a drain region 107, is formed. An interlayer insulating film 108, preferably composed of a material selected from phosphosilicate glass (PSG), borophosphosilicate glass (BPSG), tetraethyl orthosilicate (TEOS) and undoped silicate glass (USG), is deposited on the entire surface of the substrate 100 in which the transistor is formed. A contact plug 110 formed in the interlayer insulating film is in contact with the source region 106 of the transistor. A lower electrode 112 is formed on the contact plug 110.

A dielectric layer D including a lower seed layer 114, a ferroelectric layer 116 and an upper seed layer 118 is deposited on the lower electrode 112. An upper electrode 120 is formed on the upper seed layer 118, to thus complete a ferroelectric capacitor.

The seed layers 114 and 118 formed above and below the ferroelectric layer 116 prevent an imprint phenomenon from being generated in a ferroelectric capacitor by making the characteristics of the upper and lower interfaces of the ferroelectric layer match. The upper and lower seed layers 114 and 118 of the ferroelectric layer 116 are preferably formed of a material having a low crystallization temperature. By crystallizing the upper and lower seed layers 114 and 118 prior to the ferroelectric layer 116 during a thermal treatment for crystallizing the ferroelectric layer 116 into a stable perovskite structure, the ferroelectric layer 116 is crystallized from the upper and lower faces toward the center thereof. Thus, the characteristics of the upper and lower interfaces of the ferroelectric layer are the same. The upper and lower seed layers 114 and 118 are more preferably formed of a material having a ferroelectricity, i.e., a lattice constant, similar to that of the ferroelectric layer 116.

For example, in the case of forming the ferroelectric layer 116 using PZT, the upper and lower seed layers 114 and 118 are preferably formed using $PbTiO_3$ or $TiO_2$. Also, PZT having a rich Pb content and/or a higher Ti composition ratio, compared to the PZT forming the ferroelectric layer 116, may be used for the upper and lower seed layers 114, 118. If the Pb content exceeds 120% of the other constituents, or if the value of Ti/Zr is greater than 48/52, that is to say, the Ti composition ratio is high, good crystallization of these layers occurs.

Therefore, the seed layers 114 and 118 formed above and below the PZT layer 116 are first crystallized compared to the PZT layer 116 during the thermal treatment of the PZT layer 116. Thus, the PZT layer is crystallized toward the center from above and below faces thereof. Also, elements such as Pb are prevented from being diffused out to the upper and lower electrodes. Therefore, the upper and lower interfaces of the PZT layer are formed to have the same characteristics.

It is preferable that the upper and lower electrodes 120 and 112 each is formed of a material having a high barrier characteristics at the interfaces from the ferroelectric layer 16 and a stable material which is not reactive with a ferroelectric material. Therefore, a Pt-group metal such as Pt, Ir, Ru or Rh is preferably used as an electrode material. The upper and lower electrodes 120 and 112 are also preferably formed of a conductive oxide such as $IrO_2$, $RuO_2$, $RhO_2$ or $LaSrCoO_3$, to improve fatigue characteristics.

Second Embodiment of the FRAM Device

Figure 2:
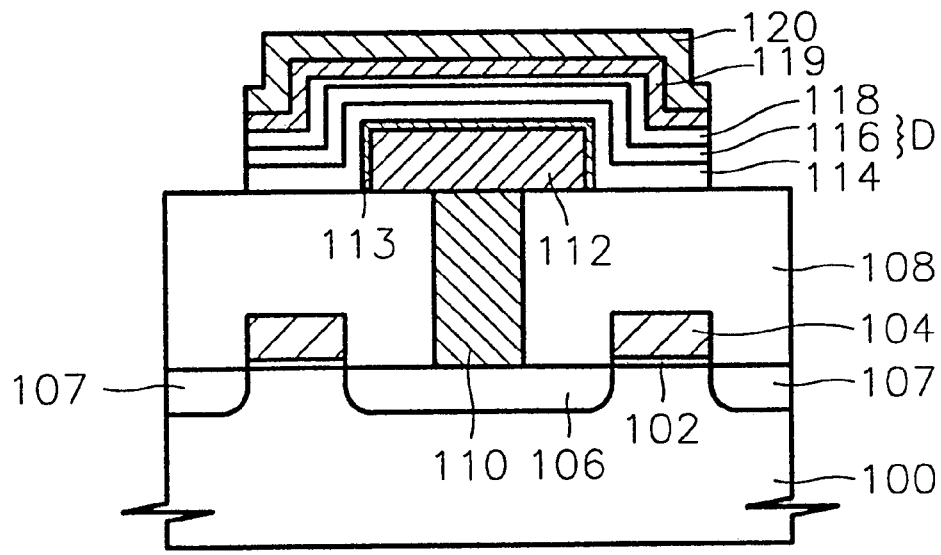
FIG. 2 is a sectional view of a FRAM device according to a second embodiment of the present invention, which operates by detecting a charge change in the ferroelectric capacitor.

FIG. 2 is a sectional view of a FRAM device according to a second embodiment of the present invention, which operates by detecting a charge change in the ferroelectric capacitor. The FRAM device according to the second embodiment of the present invention is different from that according to the first embodiment of the present invention in that a lower electrode includes two layers, preferably a Pt-group metal layer 112 and a conductive oxide layer 113, and an upper electrode includes two layers, preferably a conductive oxide layer 119 and a Pt-group metal layer 120. Preferably, $IrO_2$, $RuO_2$, $RhO_2$ or $LaSrCoO_3$ is used as a material for forming the conductive oxide layers 113 and 119.

The conductive oxide layers 113 and 119 are further formed as the constituents of the upper and lower electrodes because fatigue may be generated at a capacitor if the upper and lower electrodes thereof are formed of only Pt-group metal layers. Therefore, each conductive oxide layer is further formed between the upper seed layer and the upper Pt-group metal layer, and between the lower seed layer and the lower Pt-group metal layer, thereby improving the fatigue characteristics. The resulting capacitor includes a lower Pt-group metal layer-lower conductive oxide layer-lower seed layer-ferroelectric layer-upper seed layer-upper conductive oxide layer-upper Pt-group metal layer, and the respective layers are symmetric in view of the ferroelectric layer in the middle of the entire structure. Thus, according to the second embodiment of the present invention, an imprint phenomenon is prevented from being generated in the ferroelectric capacitor.

Third Embodiment of the FRAM Device

Figure 3:
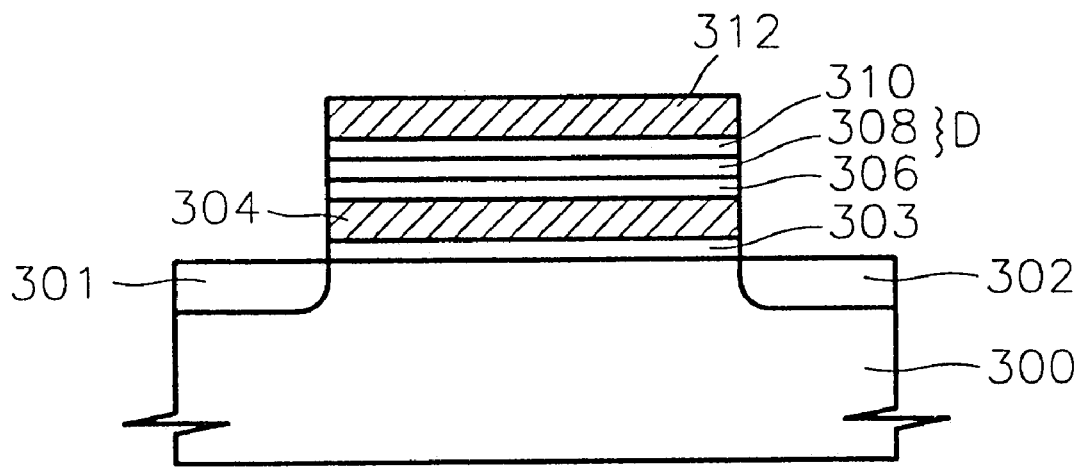
FIG. 3 is a sectional view of a FRAM device according to a third embodiment of the present invention, which operates by detecting a resistance change of a semiconductor due to spontaneous polarization of a ferroelectric material.

FIG. 3 is a sectional view of a FRAM device according to a third embodiment of the present invention, which operates by detecting a resistance change of a semiconductor due to spontaneous polarization of a ferroelectric material.

A gate insulating layer 303 is formed on a semiconductor substrate 300, and a lower electrode 304, a lower seed layer 306, a ferroelectric layer 308, an upper seed layer 310 and an upper electrode 312 are sequentially formed on the gate insulating layer 303. Also, source and drain regions 301 and 302 are formed in the semiconductor substrate 300 adjacent to the periphery of the gate insulating layer 303. Generally, the source and drain regions 301 and 302 are formed after the upper electrode 312 is formed.

In the FRAM device shown in FIG. 3, the on/off state of a channel which is to be induced in the semiconductor substrate 300 being under the gate insulating layer 303 is determined by the direction of a polarity of the ferroelectric capacitor. For example, if the channel is turned on, data is read as '1', and if the channel is turned off, data is read as '0'.

The FRAM device according to the third embodiment of the present invention is different from that according to the first embodiment of the present invention in that a memory cell is formed of one transistor. In contrast therewith, the FRAM device according to the first embodiment of the present invention is comprised of a transistor and a capacitor. However, those are the same with each other in that both FRAM devices employ a capacitor having a structure of lower electrode-lower seed layer-ferroelectric layer-upper seed layer-upper electrode. Thus, the explanation of the respective constituents will be omitted herein.

Fourth Embodiment of the FRAM Device

Figure 4:
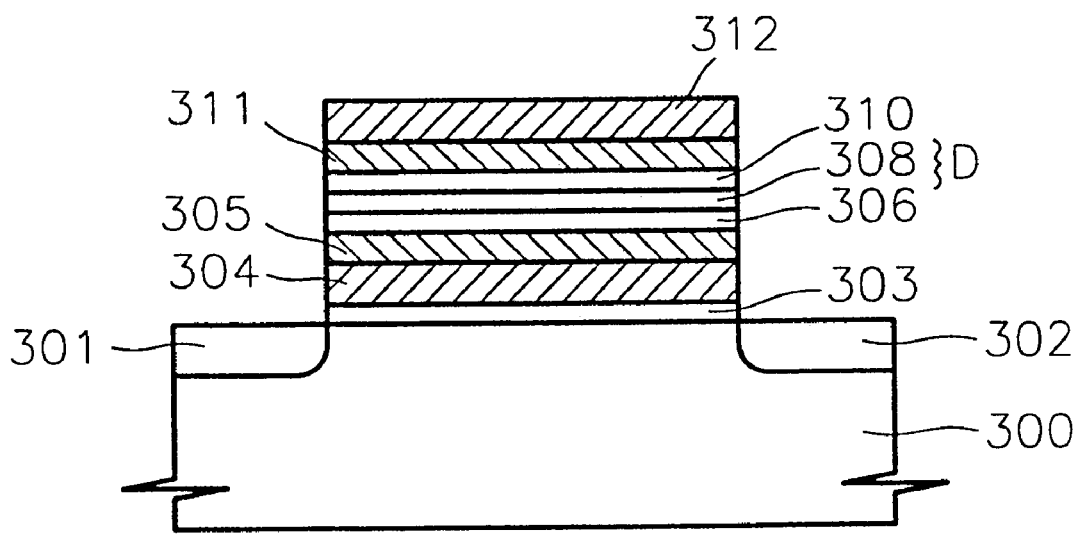
FIG. 4 is a sectional view of a FRAM device according to a fourth embodiment of the present invention, which operates by detecting a resistance change of a semiconductor due to spontaneous polarization of a ferroelectric material.

FIG. 4 is a sectional view of FRAM device according to a fourth embodiment of the present invention, which operates by detecting a change in resistance of a semiconductor due to spontaneous polarization of a ferroelectric material.

With the exception of conductive oxide layers 305 and 311 being further provided between the upper/lower seed layers 306/310 and the upper/lower electrodes 304/312, this embodiment is the same as the third embodiment. The reason of forming the conductive oxide layers 305 and 311 is as described in the second embodiment.

Fabrication Method of FRAM Device

The fabrication method of the FRAM device according to the first embodiment of the present invention will be described with reference to FIGS. 5 through 7.

Figure 5:
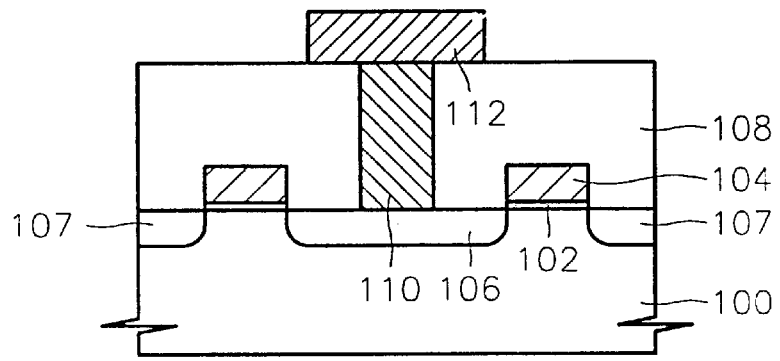
FIGS. 5 through 7 are sectional views of intermediate structures for illustrating a fabrication method of a FRAM device according to a first embodiment of the present invention, shown in FIG. 1.

Referring to FIG. 5, a transistor including a gate insulating layer 102, a gate electrode 104, a source region 106 and a drain region 107 is formed on a semiconductor substrate 100 in a conventional manner. Subsequently, an insulating material, preferably selected from PSG, BPSG, TEOS and USG, is deposited on the entire surface of the resultant structure and planarized to form an interlayer insulating film 108. Next, the interlayer insulating film 108 is partly etched to form a contact hole exposing the source region 106 and the contact hole is filled with a conductive material, thereby forming a conductive plug 110 connecting a source of the transistor and a lower electrode of the capacitor.

Then, a material for forming the lower electrode of the capacitor is deposited on the resultant structure in which the conductive plug 112 is formed, and then patterned using a conventional photolithography to form a lower electrode 112 of the capacitor. Here, the lower electrode of the capacitor is preferably formed of a Pt-group metal such as Pt, Ir, Ru or Rh, a conductive oxide such as $IrO_2$, $RuO_2$, $RhO_2$ or $LaSrCoO_3$, or a dual layer of a Pt-group metal layer and a conductive oxide layer.

Figure 6:
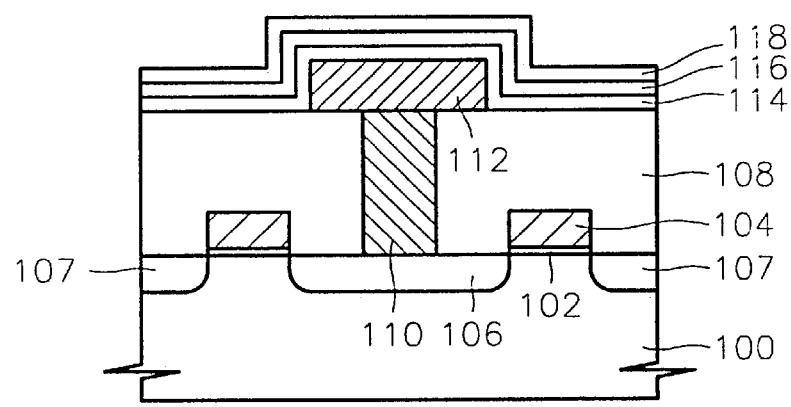

Referring to FIG. 6, a lower seed layer 114, a ferroelectric layer 116 and an upper seed layer 118 are sequentially formed on the entire surface of the resultant structure in which the lower electrode 112 is formed. After the layers including the upper seed layer 118 are formed, the resultant structure is thermally treated, thereby crystallizing a perovskite structure of the ferroelectric layer 116 and stabilizing the same.

Here, the lower seed layer 114 and the upper seed layer 118 are formed of a material which induces the ferroelectric layer 116 to be crystallized into uniform and stable perovskite structure throughout the ferroelectric layer during a thermal treatment so that the characteristics of the upper and lower interfaces of the ferroelectric layer 116 are made to be the same.

Therefore, the lower seed layer 114 and the upper seed layer 118 are formed of a material having a lower crystallization temperature than that of the ferroelectric layer 116. Also, the lower seed layer 114 and the upper seed layer 118 are formed of a material having a lattice constant similar to that of the ferroelectric layer 116. The reason of the foregoing is as follows. If the lower seed layer 114 and the upper seed layer 118 are crystallized prior to the ferroelectric layer 116 during the thermal treatment, since crystallization occurs from the upper and lower faces to the center of the ferroelectric layer 116, the resulting upper and lower interfaces of the ferroelectric layer 116 have the same characteristics. Also, the seed layers 114 and 118 are more preferably formed of a material having a ferroelectricity taking into account a capacitance of the capacitor.

Therefore, if the ferroelectric layer 116 is formed of PZT, the seed layers 114 and 118 are more preferably formed using PbTiO$_3$, TiO$_2$ or PZT having a richer Pb content and/or a higher Ti composition ratio than the PZT forming the ferroelectric layer 116. For example, if the Pb content exceeds 120% relative to other constituents, or the value of Ti/Zr is greater than 48/52, that is to say, the Ti composition ratio is high, good crystallization occurs.

When forming the lower seed layer 114 using PbTiO$_3$, a sputtering method, a metal organic chemical vapor deposition (MOCVD) method or a sol-gel method may be employed. When using the MOCVD method, tetra-ethyl lead or titanium isopropoxide are preferably used as a CVD source. When using the sol-gel method, preferably a mixed solution of lead acetate and titanium isopropoxide is deposited on the semiconductor substrate 100 by a rotation coating process, and thermally treated in the range of 500~700° C.

The lower seed layer 114 is preferably formed to a thickness of below 200 Å.

The ferroelectric layer 116 may be formed using a sputtering method, a MOCVD method or a sol-gel method. The ferroelectric layer 116 is formed of an oxide having a perovskite structure, e.g., PZT.

Advantageously, when depositing the PZT layer by the sputtering method, while the temperature of a substrate is set to 450~650° C. and the chamber pressure is maintained as 1~10 mTorr, a PZT target, e.g., a target having a composition of Pb(Zr$_{0.6}$Ti$_{0.4}$)O$_3$ and PbO(20 mol %) is sputtered under an atmosphere containing argon (Ar) and oxygen (O$_2$) to form the PZT layer.

Also, advantageously when depositing the PZT layer by the CVD method, tetra-ethyl lead, titanium isopropoxide and zirconium n-butoxide are used as the main components of the CVD source. An oxidizing gas, i.e., a source gas containing 10~50% N$_2$O and O$_2$, is flowed, with Ar as a carry gas, to a chamber in which the substrate temperature is set to 450~800° C. and the chamber pressure is maintained as 0.1~10 Torr.

The upper seed layer 118 is formed in the same manner as the lower seed layer 114.

Figure 7:
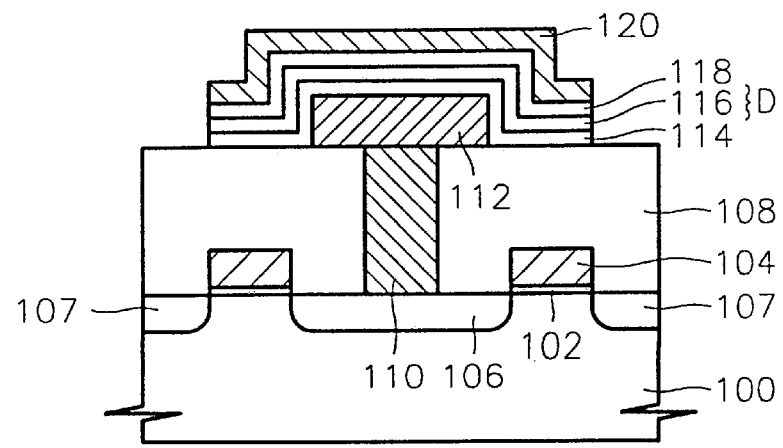

Referring to FIG. 7, the upper electrode 120 is formed on the upper seed layer 118 using the same material with that of the lower electrode 112, for the purpose of making the upper and lower components symmetric with each other relative to the ferroelectric layer 116. This helps prevent an imprint phenomenon, i.e., makes the characteristics of the upper and lower interfaces of the ferroelectric layer 116 be the same with each other.

Finally, the upper electrode 120, the upper seed layer 118, the ferroelectric layer 116 and the lower seed layer 114 are patterned to units of cells by conventional photolithography, thereby completing a capacitor cell unit.

The FRAM device according to the present invention includes seed layers above and below a ferroelectric layer. The seed layers formed above and below faces of the ferroelectric layer can prevent an imprint phenomenon from being generated in a ferroelectric capacitor by making the characteristics of the upper and lower interfaces of the ferroelectric layer be the same with each other. In other words, the upper and lower seed layers are crystallized prior to the ferroelectric layer from the upper and lower faces of the ferroelectric layer toward the center thereof during a thermal treatment. Therefore, the characteristics of the upper and lower interfaces of the ferroelectric layer are made to be the same, thereby improving ferroelectric capacitor characteristics.

The present invention has been illustrated and described with reference to specific embodiments and specific terms have been used throughout the drawings and detailed description of the invention, which is not intended limiting the scope of the invention as claimed in the appended claims but is just adopted for technical concepts. Therefore, it should be understood that the invention is not limited to the illustrated embodiment and that many changes and modifications can be made within the scope of the invention by a person skilled in the art.

What is claimed is:

1. A ferroelectric random access memory (FRAM) device comprising:

a lower electrode;

a lower seed layer formed on the lower electrode;

a ferroelectric layer formed on the lower seed layer;

an upper seed layer formed on the ferroelectric layer; and an upper electrode formed on the upper seed layer, the upper and lower seed layers being composed of the same materials and being in contact with the ferroelectric layer.

2. The FRAM device according to claim 1, wherein the ferroelectric layer is a PZT layer.

3. A ferroelectric random access memory (FRAM) device comprising:

a lower electrode;

a lower seed layer formed on the lower electrode;

a ferroelectric layer formed on the lower seed layer;

an upper seed layer formed on the ferroelectric layer; and an upper electrode formed on the upper seed layer, the upper and lower seed layers make characteristics of an upper interface and a lower interface of the ferroelectric layer match each other.

4. A ferroelectric random access memory (FRAM) device comprising:

a lower electrode;

a lower seed layer formed on the lower electrode;

a ferroelectric layer formed on the lower seed layer;

an upper seed layer formed on the ferroelectric layer; and an upper electrode formed on the upper seed layer, the upper and lower seed layers being in contact with the ferroelectric layer and being composed of a material having a crystallization temperature lower than that of a material of the ferroelectric layer.

5. The FRAM device according to claim 1, wherein the upper and lower seed layers are composed of a ferroelectric material having a lattice constant similar to that of a material of the ferroelectric layer.

6. The FRAM device according to claim 2, wherein the upper and lower seed layers are composed of PbTiO$_3$, TiO$_2$ or PZT having at least one of a higher Pb content and a higher Ti composition ratio than the PZT of the ferroelectric layer.

7. The FRAM device according to claim 1, wherein the upper and lower electrodes include a Pt-group metal layer, a conductive oxide layer or a dual layer of the Pt-group metal layer and the conductive oxide layer.

8. The FRAM device according to claim 1, further comprising:

a switching element electrically connected to the lower electrode.

9. The FRAM device according to claim 1, further comprising:

a gate insulating layer under the lower electrode;

a semiconductor substrate under the gate insulating layer; and source and drain regions in a portion of the semiconductor substrate adjacent to a periphery of the rate insulating layer.

10. The FRAM device according to claim 6, wherein the upper and lower electrodes include of a Pt-group metal layer, a conductive oxide layer or a dual layer of the Pt-group metal layer and the conductive oxide layer.

11. The FRAM device according to claim 1, wherein the upper and lower electrodes have the same structure.

12. The FRAM device according to claim 3, wherein the upper and lower seed layers are composed of the same material.

13. The FRAM device according to claim 3, wherein the characteristics are crystalline characteristics.

14. The FRAM device according to claim 4, wherein the upper and lower seed layers are composed of the same material.

15. A ferroelectric random access memory (FRAM) device comprising:
    a lower electrode;
    a lower seed layer formed on the lower electrode;
    a ferroelectric layer formed on the lower seed layer;
    an upper seed layer formed on the ferroelectric layer; and
    an upper electrode formed on the upper seed layer,
    the upper and lower seed layers being in contact with the ferroelectric layer.

* * * * *